US006862717B2

(12) United States Patent
Nadeau-Dostie et al.

(10) Patent No.: US 6,862,717 B2
(45) Date of Patent: Mar. 1, 2005

(54) METHOD AND PROGRAM PRODUCT FOR DESIGNING HIERARCHICAL CIRCUIT FOR QUIESCENT CURRENT TESTING

(75) Inventors: Benoit Nadeau-Dostie, Aylmer (CA); Dwayne Burek, San Jose, CA (US)

(73) Assignee: LogicVision, Inc., San Jose, CA (US)

( * ) Notice: Subject to any disclaimer, the term of this patent is extended or adjusted under 35 U.S.C. 154(b) by 490 days.

(21) Appl. No.: 10/015,751

(22) Filed: Dec. 17, 2001

(65) Prior Publication Data

US 2003/0115522 A1 Jun. 19, 2003

(51) Int. Cl.⁷ .............................................. G06F 17/50
(52) U.S. Cl. ..................... 716/4; 716/2; 716/7; 716/18
(58) Field of Search .............................. 716/2, 4, 7, 18; 714/30.726

(56) References Cited

U.S. PATENT DOCUMENTS

| | | | |
|---|---|---|---|
| 5,592,493 A | 1/1997 | Crouch et al. | |
| 5,796,990 A | 8/1998 | Erle et al. | |
| 5,939,897 A | 8/1999 | Ayers et al. | |
| 6,055,649 A | * 4/2000 | Deao et al. | ................... 714/30 |
| 6,061,284 A | 5/2000 | Dingemanse et al. | |
| 6,093,212 A | 7/2000 | Takahashi et al. | |
| 6,098,187 A | 8/2000 | Takahashi | |
| 6,173,426 B1 | 1/2001 | Sanada | |
| 6,175,244 B1 | 1/2001 | Gattiker et al. | |
| 2003/0110457 A1 | * 6/2003 | Cote et al. | ...................... 716/4 |

* cited by examiner

Primary Examiner—Thuan Do
(74) Attorney, Agent, or Firm—Eugene E. Proulx

(57) ABSTRACT

A method of designing a circuit having at least one hierarchical block which requires block specific test patterns to facilitate quiescent current testing of the circuit, comprises, for each block, configuring the block and any embedded blocks located one level down in design hierarchy in quiescent current test mode in which input and output peripheral memory elements are configured in internal test mode and in external test mode, respectively; generating quiescent current test patterns which do not result in elevated quiescent current levels and which include a bit for all memory elements in the block and for any peripheral memory elements in any embedded blocks located one level down in design hierarchy; and, if the block contains embedded blocks, synchronizing the test pattern with a corresponding test pattern generated for embedded blocks so that test patterns loaded in scan chains in the block are consistent with test patterns loaded in scan chains in said embedded blocks.

79 Claims, 11 Drawing Sheets internal logic
peripheral logic

Fig. 13.

TABLE 1. IDDq patterns for configuration of figure 11

| Fxxx | Fxxy | F170 | F172 | F174 | F182 | F184 | F186 | Fxxz | Fxxt |
|---|---|---|---|---|---|---|---|---|---|
| 0 | 1 | 1 | X | 0 | 0 | X | 1 | 0 | 1 |
| 1 | 1 | 0 | 1 | X | 1 | X | 0 | 0 | 0 |
| 0 | X | X | 0 | 1 | X | 1 | X | 1 | 0 |
| X | 0 | 0 | 0 | 1 | 1 | 0 | 0 | X | 1 |
| 1 | 0 | 1 | X | X | X | X | X | 0 | X |
| 1 | 0 | 1 | X | X | X | X | X | 0 | X |

TABLE 2. IDDq patterns for configuration of figure 12

| Fyyy | Fyyx | Fyyz | F172 | F174 | F182 | F184 | F186 | Fyyt | Fyyu | Fzzx | Fzzy |
|---|---|---|---|---|---|---|---|---|---|---|---|
| 1 | 1 | 0 | 1 | ■ | 0 | ■ | ■ | 0 | 1 | 1 | 0 |
| 1 | 1 | 0 | ■ | 0 | ■ | 1 | ■ | 0 | 0 | 0 | 1 |
| 0 | X | X | ■ | ■ | 0 | ■ | 1 | 1 | 0 | X | 1 |
| X | 0 | 0 | ■ | ■ | ■ | ■ | ■ | X | 1 | 0 | X |
| 0 | 1 | 0 | 1 | 0 | 0 | 0 | 1 | 0 | 0 | 1 | 1 |
| 1 | 0 | X | 0 | 0 | 1 | 1 | 1 | X | 1 | 0 | 0 |

NOTE: The values adjacent to each state transition correspond to TMS.

METHOD AND PROGRAM PRODUCT FOR DESIGNING HIERARCHICAL CIRCUIT FOR QUIESCENT CURRENT TESTING

CROSS-REFERENCE TO RELATED APPLICATION

This application is related to co-pending U.S. application Ser. No. 10/011,128 filed on Dec. 10, 2001.

BACKGROUND OF THE INVENTION

The present invention relates, in general to the design and testing of integrated circuits and, more specifically, to a method and a program product for designing circuits in a manner to facilitate quiescent current (IDDq) testing of the circuit and to a circuit designed according to the method.

The complexity of semiconductor circuits often requires partitioning the circuit design into several core modules or blocks, generally referred to as design hierarchy. The blocks can be verified and laid out independently from each other. This design approach has been used for a long time and has several benefits, the most significant of which are to accelerate the development of the design by allowing several designers to work in parallel and to reduce the difficulty for design automation tools by avoiding the need to manipulate the description of the entire circuit at once.

It has been shown recently that scan test methods can be adapted to a hierarchical design methodology by adding scannable memory elements around the periphery of core modules or by modifying functional memory elements near the periphery of modules and providing an internal and external mode of operation to these memory elements (see, for example, "A structured and Scalable Mechanism for Test Access to Embedded Reusable Cores", ITC '98. paper 12.1, Marinessen et al. and Applicants' co-pending U.S. patent application Ser. No. 09/626,877 filed on Jul. 27, 2000 for "Hierarchical Design and Test Method and System, Program Product Embodying the Method and Integrated Circuit Produced Thereby", both incorporated herein by reference.) In this divide-and-conquer approach, scan tests of modules can be prepared in advance by the designer of the core module or block without any knowledge of the context within which it will be used.

The preparation of the scan tests involves at least the verification of design-for-test rules and calculation of test coverage. During the internal scan test of blocks, the state of memory elements outside of the modules is irrelevant. The preparation also involves the generation of a simplified model of the module that can be used to perform the same steps at the next level of hierarchy of the design. The use of the simplified model eliminates the need to manipulate the entire description of core modules. During the external scan test of modules, the state of memory elements that are not involved (i.e. not near the periphery of the module) is, again, irrelevant. Core modules can be tested in parallel or sequentially.

There is one type of test that does not readily lend itself to this hierarchical design methodology. During circuit manufacturing, it is often required to measure the quiescent current (IDDq) for different states of the circuit. The quiescent current is used as a complement to the scan tests described earlier. The state of the circuit is defined by the values loaded in the memory elements of the circuit. The designer needs to ensure that each state of the circuit corresponds to a state where no static current is consumed in a good circuit. A software tool (rules checker) is typically used to perform this task. The designer can also calculate the fault coverage of the faults covered by this test using a fault simulator and/or an automatic test pattern generator (ATPG). To date, the quiescent current test, and the analysis required to perform it, requires considering the entire circuit at once which is becoming virtually impractical for large circuits.

Applicant's above mentioned cross-reference application describes and claims a circuit design and test method and circuit in which hierarchical blocks are have been designed so that they either do not include any circuit states which cause elevated current levels or which contain very few such states. Such circuits not only allow the use of pseudo-random test patterns, but also allow the use of scan chains with branches. Applicant's prior invention describes a method of excluding test patterns which cause elevated IDDq states. There exists some circuits, however, which require block specific test patterns and, therefore, the non-specific, pseudo-random test patterns cannot be employed. The present invention provides a circuit and method for designing such circuits to facilitate quiescent current testing thereof.

SUMMARY OF THE INVENTION

The present invention provides a method and program product for use in designing integrated circuits having a hierarchical architecture to facilitate quiescent current monitoring of the circuit. The method allows the state of the entire circuit to be set in a repeatable and predictable manner and avoids the need to analyze the entire circuit at once. The method is particularly concerned with hierarchical block which require block specific test patterns. However, the method of the present invention can also accommodate blocks which do not require specific test patterns.

One aspect of the invention is general defined as a method of designing a circuit having at least one hierarchical block which requires block specific test patterns to facilitate quiescent current testing of the circuit. The method comprises, for each block requiring block specific test patterns, configuring the block and any embedded blocks located one level down in design hierarchy in quiescent current test mode in which input peripheral memory elements are configured in internal test mode and output peripheral memory elements are configured in external test mode; generating quiescent current test patterns which do not result in elevated quiescent current levels and which include a bit for all memory elements in said block and peripheral memory elements in embedded blocks located one level down in design hierarchy; and synchronizing each test pattern with a corresponding test pattern generated for embedded blocks so that test patterns loaded in scan chains in the block are consistent with test patterns loaded in scan chains in said embedded blocks.

BRIEF DESCRIPTION OF THE DRAWINGS

These and other features of the invention will become more apparent from the following description in which reference is made to the appended drawings in which:

FIG. 13 illustrates two tables containing test patterns generated according to the patterns generating method of the present invention;

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

As is known in the art, integrated circuit devices are typically designed and fabricated using one or more computer data files that define the connectivity of the circuit arrangements of the devices. The files are typically generated by a design tool and are subsequently used during manufacturing to create the layout masks that define the circuit arrangements applied to a semiconductor wafer. Typically, the programs are provided in a predefined format using a hardware description language (HDL) such as VHDL, verilog, EDIF, etc. While the invention has and hereinafter will be described in the context of fully functioning integrated circuit devices and data processing systems utilizing such devices, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others and transmission type media such as digital and analog communications links.

Figure 1:
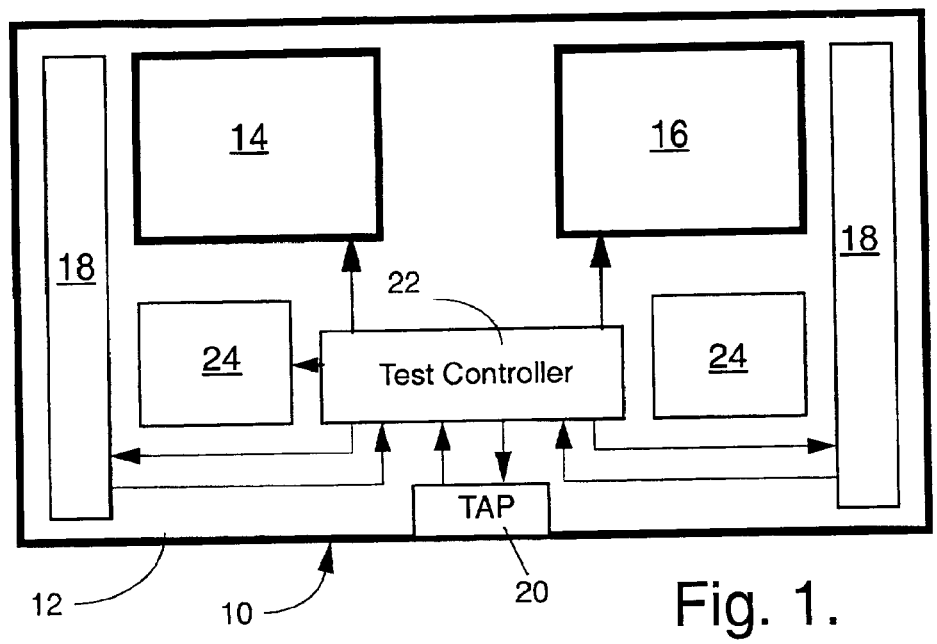
FIG. 1 is a diagrammatic block view of a circuit according to one embodiment of the present invention.
Figure 15:
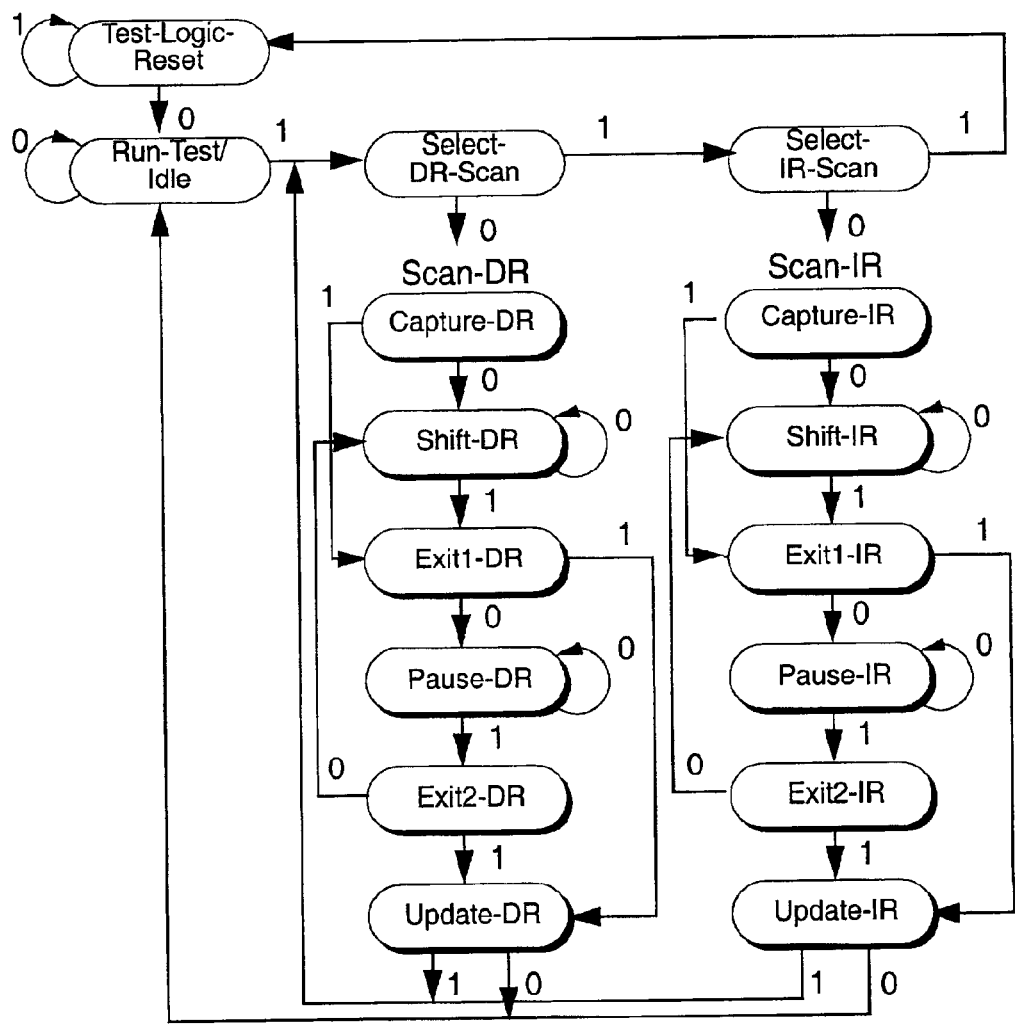
FIG. 15 is a state diagram of a Test Access Port according to the IEEE 1149.1 standard.

FIG. 1 illustrates a simple hierarchical circuit 10 according to one embodiment of the present invention. The circuit includes a top-level hierarchical block 12, two embedded hierarchical functional blocks 14 and 16, a boundary scan register 18, a Test Access Port (TAP) 20, and a test controller 22. FIG. 15 is a state diagram of a TAP according to the IEEE 1149.1 standard. Reference numeral 24 represents logic in top-level block 12. Blocks 14 and 16 are contained within or embedded in the top-level block and, thus, are located one level down in design hierarchy. Two hierarchical blocks are shown for illustration purposes only. It is to be understood that the circuit may have any arbitrary number of hierarchical blocks and levels. The TAP and boundary scan register are preferred, but not essential to the invention. Typically, blocks 14 and 16 provide a unique function. There may be several reasons why these blocks are partitioned from the main or host block, Some blocks may have been previously designed; others may have been obtained from a third party core provider; still others may be formed by encapsulating a large sub-circuit to simplify the design of the circuit.

Figure 2:
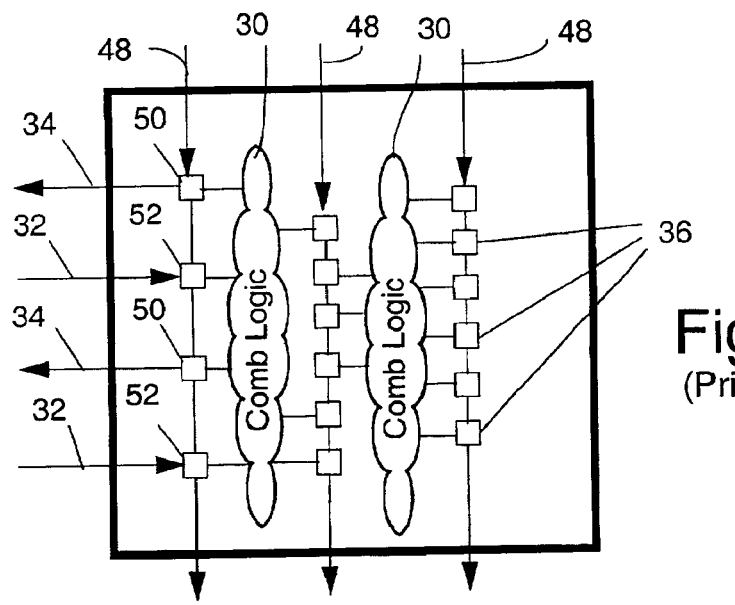
FIG. 2 is a diagrammatic view of a hierarchical block showing scannable memory elements arranged in scan chains and peripheral memory elements associated with block inputs and outputs.
Figure 3:
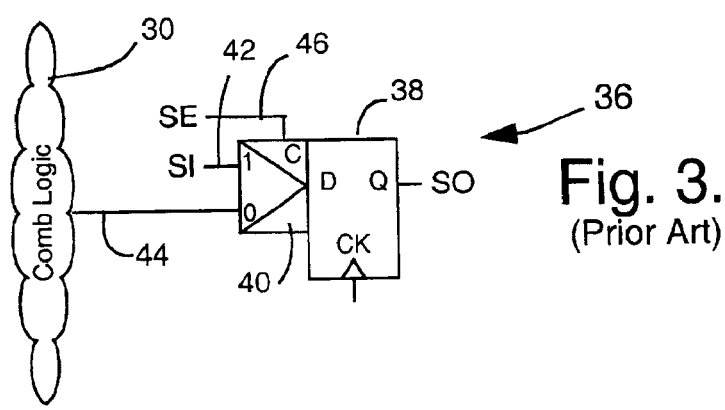
FIG. 3 diagrammatically illustrates a prior art scannable memory element.

FIG. 2 is a diagrammatic view of the internal structure of a typical hierarchical block. The block generally includes combinational logic 30 and block inputs 32 and block outputs 34, by which the block communicates with other blocks during normal operation of the circuit, and memory or storage elements 36 which store data during normal operation of the circuit as well as during various test modes of operation. The memory elements are designed to be scannable to allow a test stimulus to be scanned into the elements and a test response data to be scanned out. FIG. 3 illustrates one arrangement of a typical scannable memory element 36. The element receives input from combinational logic 30. The memory element includes a flip-flop 38 having a data input, D, a data output Q and a clock input, CK. Input D is connected to the output of a multiplexer 40. One input 42 of the multiplexer is connected to a memory element serial input, SI. The other input 44 of the multiplexer is connected to an output of combinational logic 30. A control input 46 of the multiplexer receives a scan enable signal, SE, which operates to configure the memory element in scan or shift mode when SE is active (logic 1) and in capture or normal mode when SE is inactive (logic 0). Output Q also serves as the memory element Serial Output, SO.

Referring again to FIG. 2, when scan enable SE is active, the scannable memory elements are serially interconnected into one or more scan chains 48 by connecting the serial output SO of each memory element to the serial input SI of another memory element. The serial input of the first memory element in the chain is connected to a scan chain serial input. The serial output of the last memory element in a scan chain is connected to a scan chain serial output.

Memory elements located at the periphery or boundary of a logic block are referred herein to as "peripheral memory elements", but also known in the art as "partitioning scan cells". Elements which output a signal from the block, such as memory elements 50, are output peripheral memory elements. Elements which receive a signal applied to the block, such as memory elements 52, are input peripheral memory elements. The preferred form of peripheral memory elements are of the type disclosed and claimed in Applicant's above mentioned co-pending U.S. application patent application Ser. No. 09/626,877 which uses functional memory elements as peripheral memory elements to partition a block into an internal partition and an external partition and thereby provide module or block isolation. However, the present invention can be employed in a circuit which uses conventional test dedicated peripheral memory elements. Both forms of peripheral elements are described and illustrated in the aforementioned application.

Output peripheral memory elements are configurable in "external test mode" in which data contained in the memory element is applied to its associated block output node which, in turn, is connected to external circuitry. When the element is not in external test mode, data generated by the block is passed through to the output node. This allows test data to be scanned in to the output peripheral memory elements to test the response of external circuitry to various values of block outputs. Similarly, input peripheral memory elements are configurable in "internal test mode" in which data contained in the peripheral memory element is passed on to the internal circuitry of the block. When the element is not in internal test mode, data applied to its associated block input node is applied to the internal circuitry of the block. This allows test data to be scanned in to the input peripheral memory elements to test the internal logic of the block.

The top-level block need not necessarily be provided with peripheral memory elements. In this case, the boundary scan register chain can be used as a peripheral chain. However, this is not necessary because access to chip inputs and outputs is available. Peripheral memory elements may be included in the top-level block if the complete circuit may itself constitute a block which may be embedded into another circuit.

Input and output peripheral memory elements are normally not configured in their respective active mode concurrently. In the present invention, however, the test controller is provided with circuitry (not shown) which responds to an active quiescent current test signal by applying a signal to input and output peripheral memory elements which concurrently configures input peripheral memory elements in internal test mode and output peripheral memory elements in external test mode. This configuration is referred to herein as a "peripheral memory element quiescent current test mode". This mode allows the peripheral memory elements to be arranged in a scan chain segment and a simplified model of embedded blocks to be substituted for the complete description of the block during analysis of a parent block, as explained more fully later in the description of the method of the present invention. In addition, it allows test data scan in to input and output peripheral memory elements to be concurrently applied to block internal logic as well as to logic external to a block.

Scan chain segments may be arranged in the same manner as that described in Applicants' aforementioned cross-referenced application in which internal and peripheral memory elements are arranged into scan chains for use in loading quiescent current test patterns into the various hierarchical blocks in the circuit. In general, in IDDq test mode, scan chain segments of a block are arranged on a scan path which originates from or includes a block serial input by connecting a segment serial input to a block input, to the serial output of another segment in the block or to the serial output of a segment located in an embedded block one level down in design hierarchy and by connecting the block serial input of embedded blocks to the block serial input. Electronic files stored on a computer readable storage medium describe the scan paths of the block and the scan paths of embedded blocks and allows for pattern generation. In this arrangement, some rules checking (e.g. scan path continuity) and verification/simulation is performed in an indirect manner in which other scan test modes are rules checked and verified/simulated and it assumed that the IDDq test mode is correct by construction. Thus, this general configuration does not place any restrictions on internal and peripheral segments.

This configuration also allows the use of simplified models and contains all scan paths and peripheral logic which, in turn, allows for a complete analysis including rules checking, pattern generation and verification (i.e. simulation). The configuration provides significant size reduction in the size of simplified models, but is not optimal.

Figure 4:
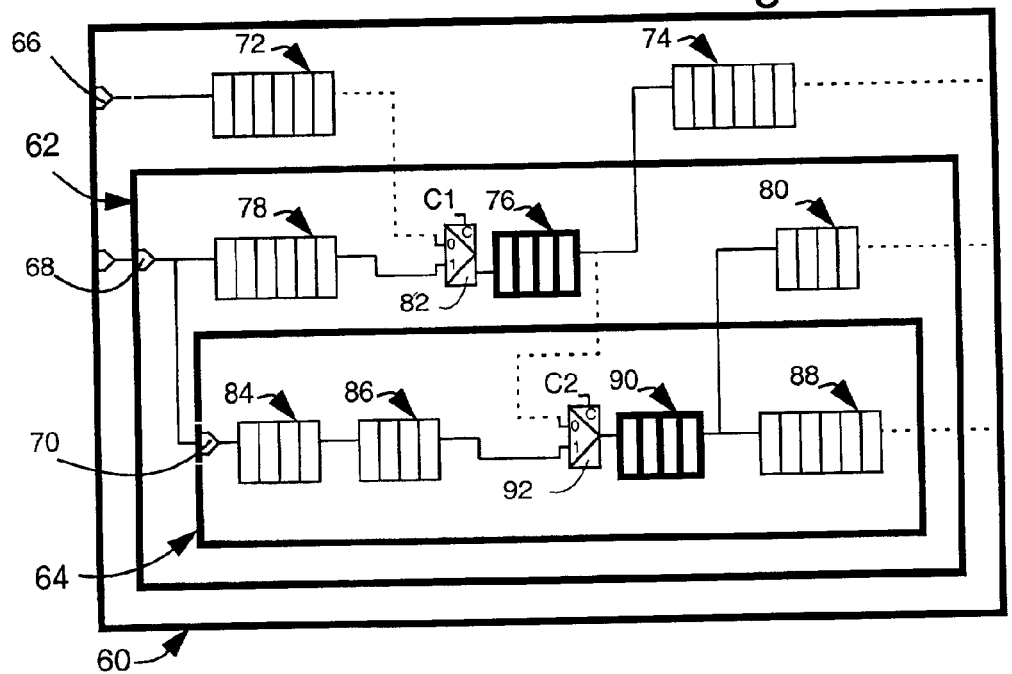
FIG. 4 diagrammatically illustrates a circuit having three levels of hierarchy and showing the manner in which scan chain segments may be connected according to one embodiment described in the above mentioned cross-referenced application.

This general configuration will be better understood by referring to FIG. 4 which illustrates a circuit having three levels of hierarchy. The figure shows three blocks including a top level block 60 having an embedded block 62 which defines a second level of hierarchy and which, in turn, has an embedded block 64 which defines a third level of hierarchy. Scan chain segments are shown as a sequence of rectangles which represent memory elements. Peripheral segments are shown in heavy or bolded lines. A segment may consist of one or more scannable memory elements. Blocks 60, 62 and 64 are provided with block serial inputs 66, 68 and 70, respectively. For simplicity, each block is shown as having only one block serial input. However, more than one block serial input may be provided without departing from the spirit of the invention. Host block 60 includes two internal segments 72 and 74 and no peripheral segments. Segment 72 is connected to top level block serial input 66, the chip circuit input. Embedded block 62 includes two internal segments 78 and 80 and a peripheral segment 76. In this simple example, block 62 is provided with means, in the form of a multiplexer 82, for selectively connecting the serial input of peripheral segment 76 to one of two sources including the output of internal segment 78 of block 62 or to the serial output of internal segment 72 of parent block 60. Multiplexer 82 is controlled by a control signal C1. The output of peripheral segment 78 is connected to the input of internal segment 74 of parent block 60.

Embedded block 64, which resides in the third level of hierarchy, has four segments, including internal segments 84, 86 and 88, and peripheral segment 90. Segments 84 and 86 are serially connected together, with the input of segment 84 being connected to block serial input 70. A multiplexer 92 receives the serial output of peripheral segment 78 in parent block 62 and the output of internal segment 86 and applies its output to peripheral segment 90. Multiplexer 92 is controlled by control signal C2. The serial output of peripheral segment 90 branches to internal segment 80 of parent block 62 and internal segment 88 of block 64. It will be seen that all segments reside on scan path which originates from or includes a block serial input. The serial input of block 64 is connected to the serial input of parent block 62. Control signals C1 and C2 are mode signals which are used to define different scan chains configurations for scan testing and quiescent current testing of the circuit. A specific example of various modes is given below with reference to FIG. 5.

It will be seen that the general configuration described above allows segments which depend on internal segments of embedded blocks. In some cases, this can lead to complications with regard to generating and verifying test patterns to be used during quiescent current testing. As described in the aforementioned cross-reference application, these complications can be simplified by placing restrictions on the connections of internal and peripheral scan chain segments as described below.

In IDDq test mode, internal segments are arranged on a scan path which originates from or includes a block serial input by connecting the internal chain segment serial input to: a block input, the serial output of another segment in the block or to the serial output of a peripheral segment located in an embedded block one level down in design hierarchy. Thus, the primary difference between this configuration and the general configuration described above is with regard to the third option. More specifically, if an internal segment is connected to any segment in an embedded block, it must be connected to the output of a peripheral segment.

Figure 5:
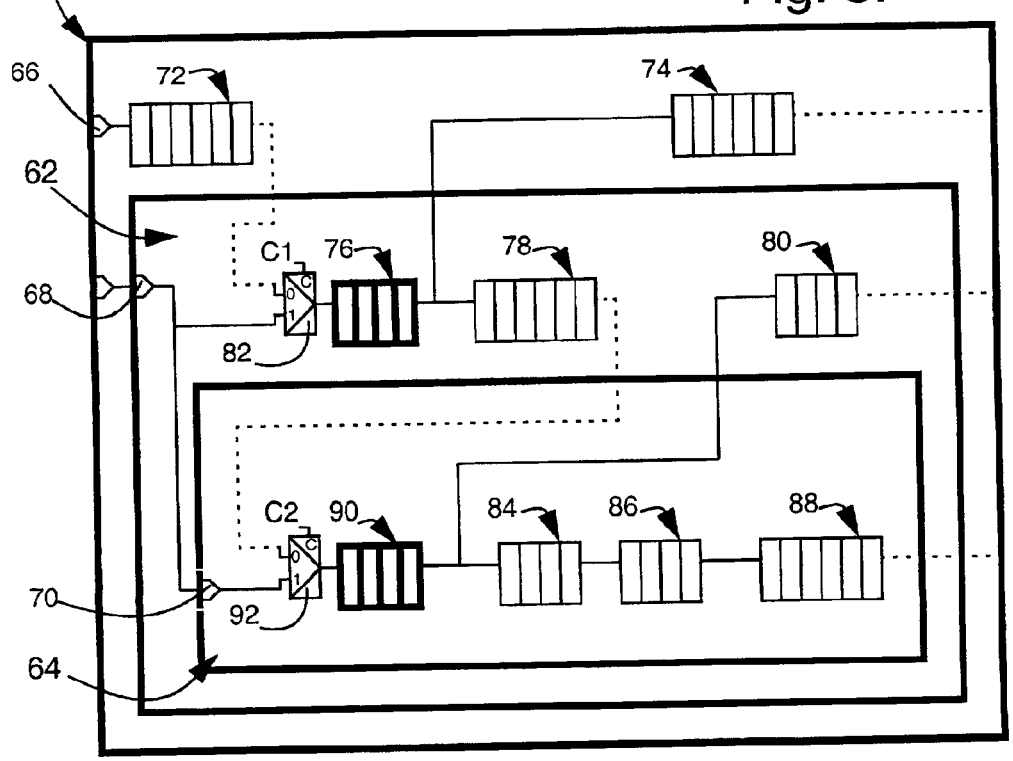
FIG. 5 diagrammatically illustrates a circuit having three levels of hierarchy and showing the manner in which scan chain segments may be connected according to a preferred embodiment described in the above mentioned cross-referenced application FIG. 6 diagrammatically illustrates a circuit having three levels of hierarchy and showing the manner in which scan chain segments may be connected according to an embodiment of the present invention.

Further, In IDDq test mode, peripheral segments are arranged on a scan path which originates from or includes a block serial input by connecting the peripheral segment serial input to a block input, to the serial output of another peripheral segment of the block or to the serial output of a peripheral segment located in an embedded block. Thus, this limits the sources for peripheral segments to either the block serial input or to the output of another peripheral segment in the block or in an embedded block. This configuration is illustrated in FIG. 5 which has the same three blocks and scan chain segments as in FIG. 4 and uses the same reference numerals used in the latter to designate like parts. Referring to FIG. 5, it will be seen that internal segments 74 and 80 have their serial inputs connected to the output of segments in an embedded block. In both cases, the source is the output of a peripheral segment, namely segments 76 and 90, respectively. All other internal blocks are connected to other segments in their respective block. The circuit is in IDDq mode when control signals C1 and C2 are both active (logic 1). The scan chains which are formed in this mode are indicated by the solid lines which interconnect the various segments. The dotted lines indicate other scan test modes. Thus, it will be seen that, in IDDq mode for the FIG. 5 example, peripheral segments 76 and 90 are connected directly to their respective block serial input and are the first segment in their respective scan chains. In IDDq mode, the circuit of FIG. 5 has five IDDq chain chains which together collect all memory elements in the circuit. A first scan path comprises segment 72 in block 60; a second scan path comprises segments 76 and 74; a third scan path comprises segments 76 and 78; a fourth scan path comprises segments 90 and 80, and a fifth scan path comprises 90, 84, 86 and 88.

In addition to defining an IDDq mode, control signal C1 and C2, define three scan test modes which are used to test the three blocks individually. C1 and C2 are set to 0,0 to perform a scan test of top level block 60. The scan path formed collects segments 72, 76 and 74. C1 and C2 are set to 1,0 to perform a scan test of block 62. The scan path formed collects segments 76, 78, 90 and 80. C1 and C2 are set to [0,1] to perform a scan test of embedded block 64. The scan path formed collects segments 90, 84, 86 and 88. It will be noted that the scan chains for blocks 60 and 62 include the peripheral segment of their embedded blocks. It will be understood by those skilled in the art that other scan chains may be formed for other tests.

The configuration described above allows segments which depend on internal segments of embedded blocks. Such an arrangement is acceptable when for the two types of blocks contemplated, i.e. block which either do not contain any circuit states which result in elevated circuit states or blocks which contain only very few such states. In the first type of block, pseudo-random quiescent current patterns may be applied concurrently to all blocks in parallel. In the second type of block, the few test patterns which do cause elevated quiescent current levels may simply be excluded from the test patterns applied to circuit during quiescent current testing. However, for circuits which have many such circuit states or for circuits which must use a specific or deterministic test pattern, this configuration can lead to complications in generating and verifying test patterns to be used during quiescent current testing. The number of test patterns which would need to be excluded would be so large that excluding such patterns is not a feasible approach. Block specific patterns may also be required when a specific fault coverage must be achieved with a smaller number of patterns. The circuit design method of the present invention, described later, provides a test pattern generation and merging method which overcomes this problem. The problem may be further simplified by the use of the scan chain segment arrangement shown in FIG. 6.

As in the aforementioned cross-referenced application, segments of a block are arranged on a scan path which originates from or includes a block serial input by connecting the serial input of segments and embedded blocks to a block input, the serial output of another segment or to the serial output of a segment included in an embedded block and means is provided in the circuit for concurrently configuring input peripheral memory elements in internal test mode an output peripheral memory elements in external mode during quiescent current testing of the circuit.

The above allows segments which depend on internal segments of embedded blocks. To simplify the design and verification of the test patterns which will be used during quiescent current testing of the circuit, the present invention imposes the following restrictions on internal and peripheral scan chain segments.

For Internal segments, the same constraints apply with the additional constraints that the scan path does not branch to paths which are not either simple logic or identical logic and, the serial input of scan paths which include internal segments of embedded blocks are connected to a block serial input.

Peripheral segments of a block are arranged on a scan path which originates from or includes a block serial input by connecting the serial input of each segment to a block input or the serial output of another peripheral segment. Thus, peripheral segments must be located at the beginning of a scan path. In addition, the serial input of scan paths consisting exclusively of peripheral segments of embedded blocks are connected to to a block serial input, to the serial output of another segment (internal or peripheral) within the block or to the serial output of a peripheral segment located in an embedded block. As with internal segments, the scan path does not branch to paths which are not either simple logic or identical logic.

Figure 6:
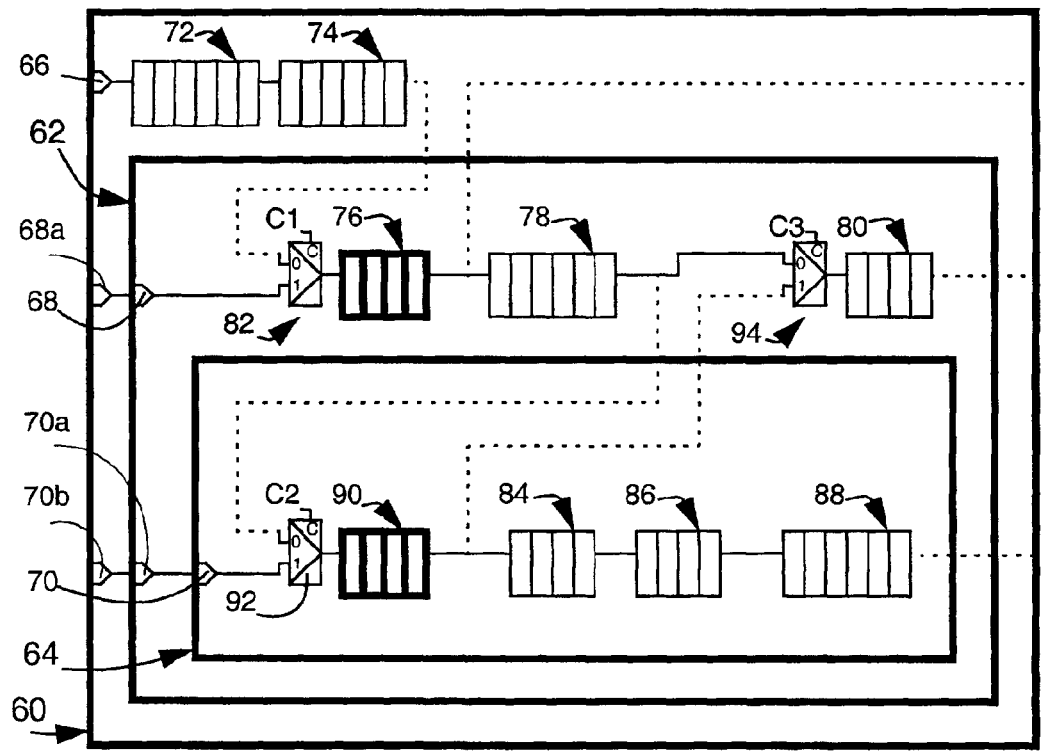

The above scan path rules will be better understood by reference to FIG. 6. The solid lines interconnecting segments represent connections which are made during IDDq testing and the dotted lines illustrate connections during other scan test modes.

In top level block 60, internal segments 72 and 74 are serially connected together to form one scan path having an input connected to block serial input 66. This scan path does not have any branches and block 60 does not have any peripheral segments.

Block 62 includes two internal segments 78 and 80. The serial input of segment 78 is connected to the serial output of peripheral segment 76. The serial input of segment 80 is connected to the output of multiplexer 94. In IDDq mode, control input C3 is logic 0 and the 0 input of multiplexer 94 is connected to the serial output of internal segment 78. The serial input of peripheral segment 76 is connected to the output of multiplexer 82. The control input C1 of the multiplexer is logic 1 in IDDq mode. The 1 input of the multiplexer is connected to the block serial input 68, which, in turn, is connected to a second block serial input 68a in its parent block, top level block 60. Thus, the three segments in block 62 form a single IDDq scan chain which does not have any branches and whose serial input is a block serial input. In addition, all peripheral segments are located at the beginning of the chain.

Block 64 has four segments, including peripheral segment 90 and internal segments 84, 86 and 88. The four segments are connected in series, with the peripheral segment being located at the beginning of the scan chain. The serial input of peripheral segment 90 is connected to the block serial input 70 through multiplexer 92. Multiplexer 92 has a control input C2 which is logic 1 in IDDq test mode. Serial input 70 is connected to serial input 70a in its parent block 62. Serial input 70a is connected to serial input 70b in top level block 60. Thus, the four segments in block 64 form a single IDDq scan chain which does not have any branches and whose serial input is a block serial input. In addition, all peripheral segments are located at the beginning of the chain. None of the blocks in the illustrated circuit has any scan paths consisting exclusively of peripheral segments in embedded blocks.

Thus, it will be seen that circuit 60 has three scan chains which are used to perform IDDq testing of the circuit and is an example of a circuit which requires each block to receive its own block specific test pattern. It is to be understood, however, a circuit may be comprised of one or more blocks which requires block specific IDDq test patterns and other blocks which can receive pseudo-random patterns as described in Applicants' cross-referenced application.

Figure 7:
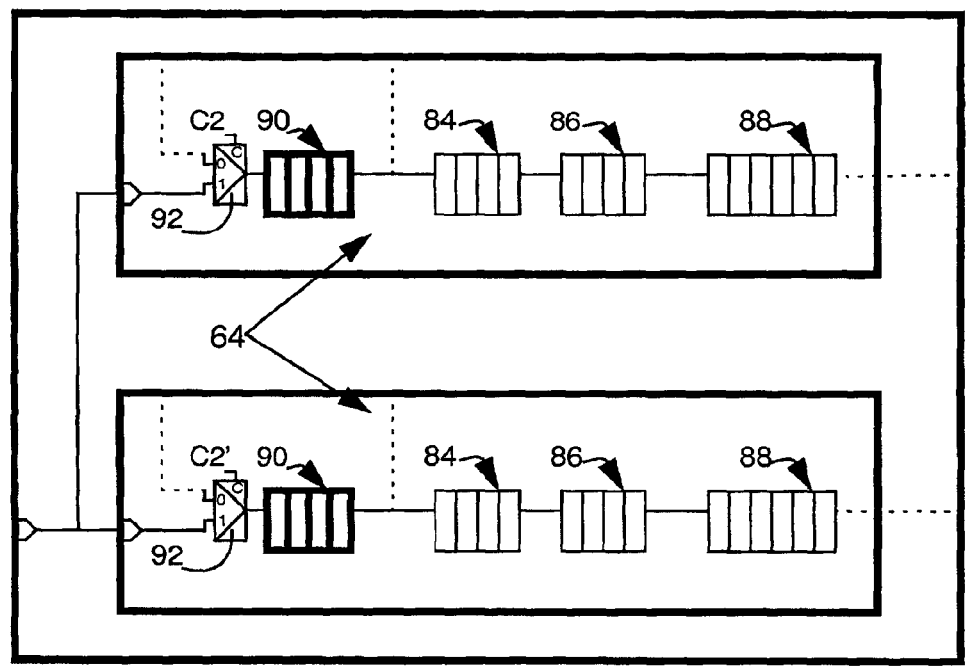
FIG. 7 diagrammatically illustrates a circuit having two levels of hierarchy and showing the manner in which scan chain segments may be connected according to an embodiment of the present invention.

As mentioned, there are two situations in which scan paths may branch. The first situation is when a scan path segment feeds identical portions of logic. This logic can be located in different branches provided that the logic is arranged to receive the same bits of the IDDq test pattern. The logic can be contained within the same block or in embedded blocks. FIG. 7 illustrates this situation which includes two instances of block 64 connected to a same circuit input. Thus, a branch is acceptable when the scan path branches to identical circuits.

The second situation is a scan path segment feeds simple logic. For example, in FIG. 5, the bits of segment 74 will always be the same as the bits of segment 78. The typical case would be that the bits of segment 78 will have been calculated by an ATPG and the logic driven by segment 74 is easily testable by any sequence of bits.

Figure 8:
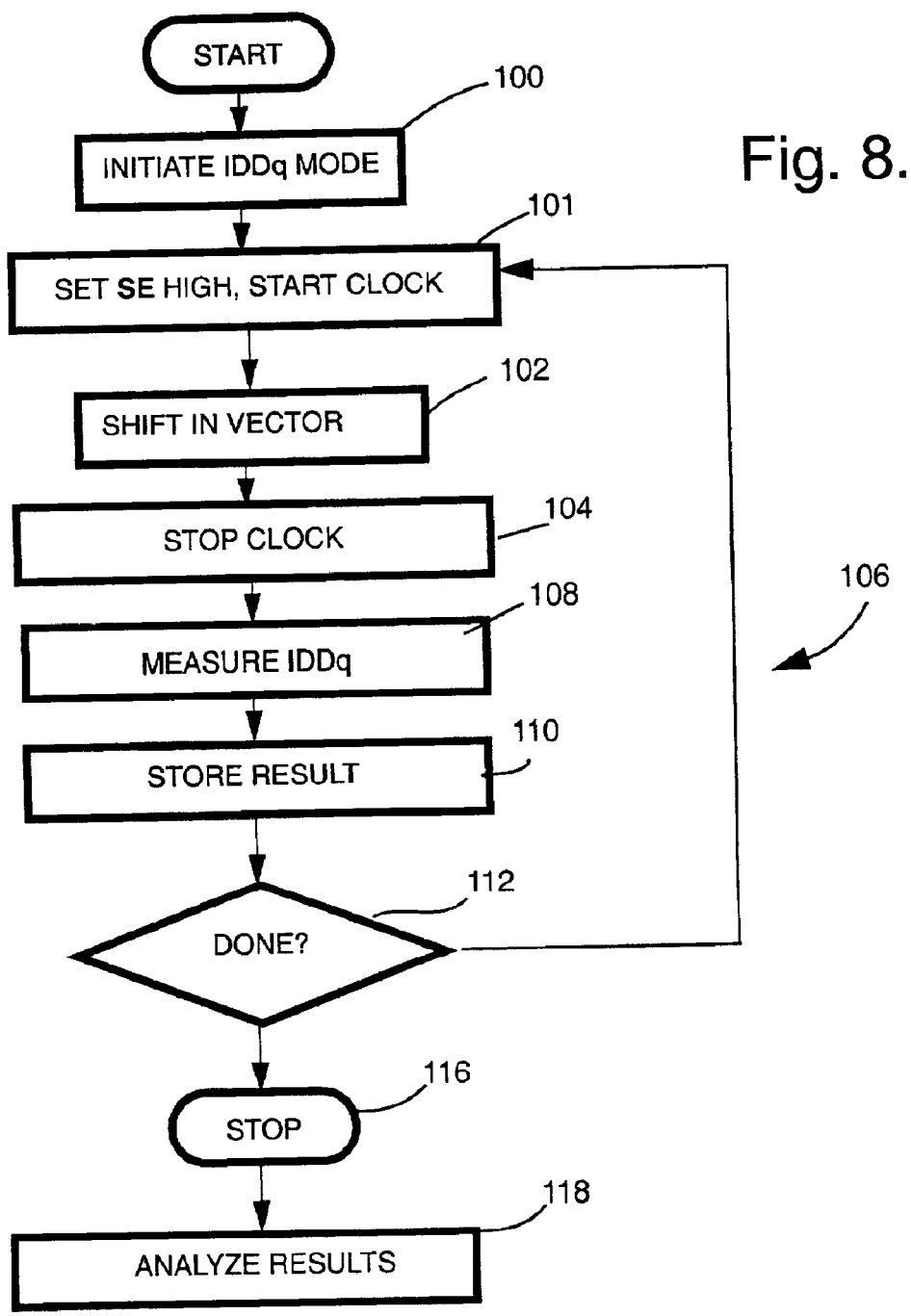
FIG. 8 is a flow chart illustrating the method of performing a quiescent current test on a circuit designed according to an embodiment of the method of design of the present invention.

A circuit constructed as described above may have quiescent testing performed as described below with reference to FIG. 8 which illustrates a flow chart of the various steps of the method. The circuit is placed in quiescent current test mode (step 100) by applying an appropriate instruction to the chip. In response, the test controller generates an appropriate Mode signal whereby the serial input of each block is connected to its predetermined circuit primary serial input, and the serial input of each block scan chain is connected to the block serial input. This establishes a scan path to all scannable memory elements in all blocks in the circuit. Next, the scan enable signal is set high (logic 1) and a test clock is started (step 101), to initiate a quiescent current measurement procedure, indicated generally by reference numeral 106. Respective quiescent current test patterns are then serially loaded into each block through the predetermined circuit serial inputs and into each scan chain of each block in parallel (step 102) until the sequences of bits of for each path have been fully loaded in all scan chains. At that point, the clock is stopped (step 104). Alternatively, the measured quiescent current value can be compared to a predetermined value. For some of the patterns, control signal SE can be set low after the clock has been stopped in step 104 to increase the fault coverage of the procedure. Next, the quiescent current of the circuit is measured (step 108), and the measured quiescent current value and the test pattern identifier are stored (step 110). Steps 101, 102, 104, 108, 110 are repeated a predetermined number of times (step 112), following which, the test is complete (step 116). The test results are then analyzed in any desired manner (step 118).

The description now turns to the method of designing blocks to enable a circuit for quiescent current testing according to the present invention. As is evident from the foregoing, the quiescent current test method of the present invention employs a scan mode of operation by which quiescent current test patterns are shifted into memory elements of the entire circuit. The method is both repeatable and predictable. The operations described below are performed on a description of a circuit under development.

It is assumed at the outset that functional memory elements in all blocks have been converted to scannable memory elements to include a multiplexer, such as multiplexer 40 in FIG. 3 so that the memory elements are configurable in scan mode and capture mode, and provision has been made to provide peripheral memory elements. Test dedicated memory elements may be inserted between the inputs and output of combinational logic of the block and the input and output nodes, respectively, of the block. Alternatively, as described and claimed in Applicant's co-pending application, functional memory elements at the periphery or boundary of each block may be converted to peripheral memory elements. In the illustrated example of FIG. 6, each of the blocks shown therein have been so modified.

The following steps are performed on selected blocks in the circuit. It will be understood by those skilled in the art that any sub-circuit may be selected or designated as a hierarchical block. Each selected block must be provided with peripheral memory elements.

The first step is to arrange the internal scannable memory elements in each hierarchical block into IDDq scan chains according to the rules described earlier with reference to FIGS. 4–7 and to insert means in the circuit for concurrently configuring input peripheral memory elements in internal test mode and output peripheral memory elements in external test mode during quiescent current testing of the circuit. This step is performed by an appropriate software tool which determines the appropriate scan chains from the circuit description using the above described segment connection rules.

Once the scan chain segments and chains in a hierarchical block have been defined and the block descriptions modified, particulars of the IDDq scan chains are stored on a storage medium for future use in developing the scan chains of higher level blocks and the test patterns which will be used during IDDq testing.

Figure 9:
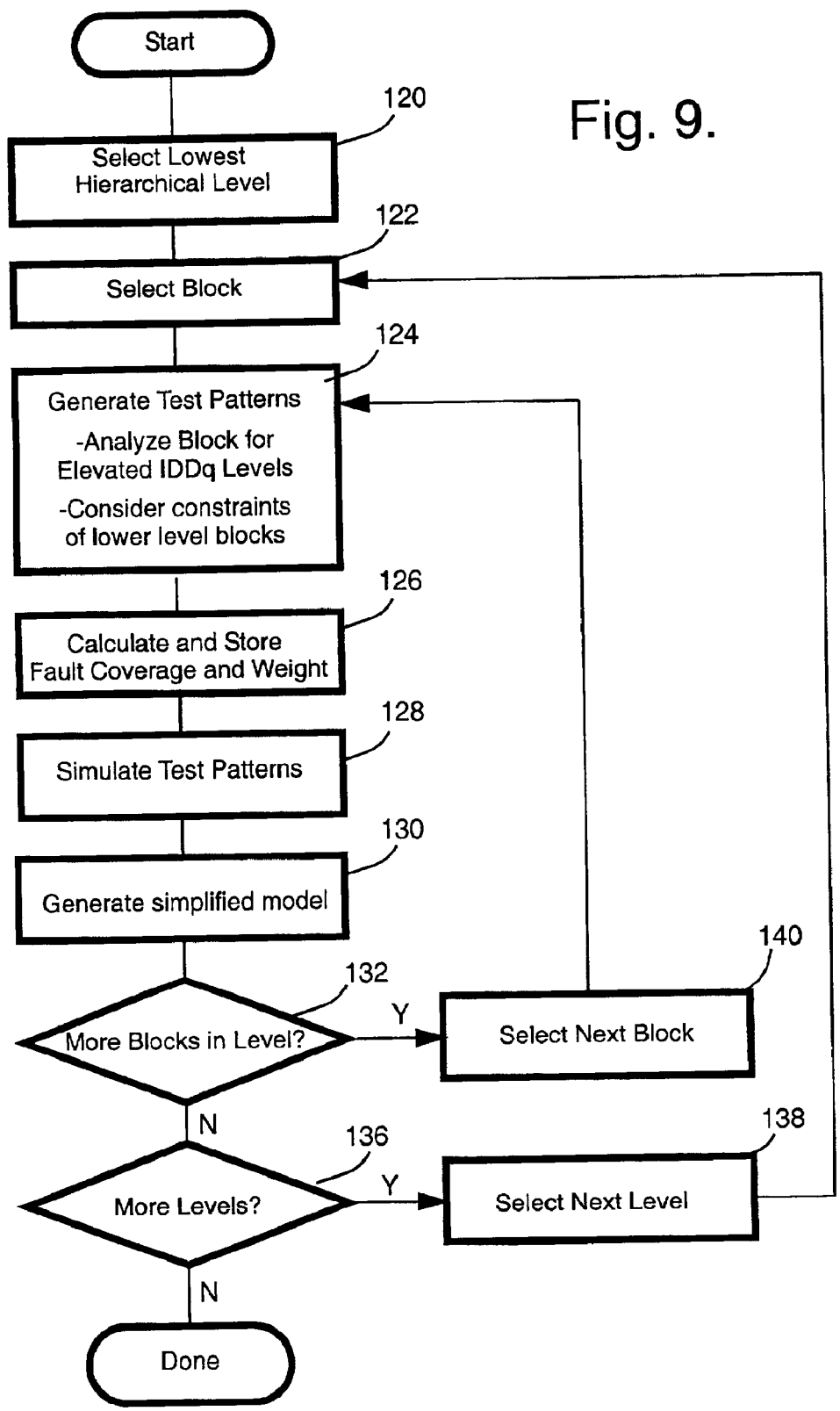
FIG. 9 is a flow chart generally illustrating a method of designing a hierarchical circuit for quiescent current testing according to an embodiment of the present invention.

FIG. 9 is a flow diagram which illustrates the steps of the design method following development of the scan chains. This part of the design process is performed on individual blocks in isolation, beginning with the blocks at the lowest level of hierarchy and progressing upwardly to the highest level. This is referred to as a bottoms-up analysis. The circuit in FIG. 6 will be used as an example. The first step (step 120) is to select the lowest level of hierarchy and then select a block (step 122) in the selected level. In the example, the lowest level is level three which contains one block, block 64. Block 64 is selected for processing. A test pattern generation process is then performed (step 124). This process is described more fully below with reference to FIG. 10. This is followed by calculating and storing a fault coverage (step 126) for the block. For a block which contains embedded blocks, the fault coverage of the block is calculated by considering only the logic contained within the block itself and the peripheral logic of embedded blocks located at one level down in design hierarchy. The total fault coverage of the block is calculated by determining the weighted sum of the fault coverage of the block and of its embedded blocks. The block fault coverage may be weighted in any desired manner, such as by the number of gates contained in each block. It will be appreciated that the fault coverage of an embedded block may itself be the result of a weighted sum because of embedded blocks that are further down in the design hierarchy. Overall full chip IDDq fault coverage numbers are, in the case of flat logic BIST designs, reported directly by a software tool and, for hierarchical designs, the fault coverage reports for individual blocks are combined with individual block level coverages to accumulate the final coverage numbers and stored, as shown at 220 in FIG. 14.

Next, test patterns which were generated in step 124 are simulated or verified (step 128). The patterns are fault simulated in a logic simulator using any desired fault model such as a "toggle fault model" or a "pseudo stuck-at fault model", both of which are well known to those skilled in the art. The purpose of simulation, or verification, of the application of the test patterns is to verify their correctness and is optional in a design environment in which the connections of the various scan segments are automated. However, it might be desirable to perform such simulation in a circuit simulator (e.g. Verilog or VHDL) with full timing information to ensure that the circuit will operate as predicted.

The capture cycle is not preformed during the application of these block level patterns for verification. Thus, the patterns will appear similar to a flush pattern where a bit stream is shifted into the registers, and the bit stream is then shifted out serially. Comparison of the shifted out bit stream would confirm that the process is working correctly. If the current measurement is to be performed at the end of a pattern, and each pattern is to be a standalone entity, then the above discussion respecting verification does not apply. Instead verification would consist of replacing the quiescent current measurement step with a parallel load compare step to ensure that each memory element is in the correct state. By replacing the current measurement with a parallel load compare, the robustness of the process can be validated.

Verification at the top level is complicated due to the hierarchy. If a single scan chain throughout the whole design is used, the whole design would normally have to be loaded to perform the simulation. This difficulty is avoided by generating IDDq simplified models for embedded blocks. These IDDq simplified models look similar to conventional shell models but contain all internal memory elements as well as peripheral memory elements and logic. The internal logic associated with these internal memory elements would not be included and their functional inputs are left un-driven. During simulation, since a capture cycle is not performed, these IDDq simplified models are sufficient for all verification purposes. To accelerate simulation, these IDDq simplified models can use behavioral or RTL constructs, but this may invalidate a parallel compare verification mechanism.

Finally, at the discretion of the designer, a simplified or shell model of the block is generated and stored (step 130). This model will be used in the processing of the parent block. A simplified model need not be generated for all embedded blocks, but rather may be limited to certain blocks, such as blocks which exceed a predetermined size. The simplified model may contain a description of only the peripheral scannable memory elements or, additionally, some peripheral logic, as described and claimed in Applicant's aforementioned application Ser. No. 09/626,877.

If there are more blocks in the hierarchical level (step 132), the next block is selected (step 134) and steps 124 to 132 are repeated. In the illustrated example, there are no other blocks in the third level. If all blocks in the current level have been processed and there are more levels to analyze (step 136), the next level is selected (step 138) and steps 122 to 136 are repeated. In the example, the second level is selected for processing and block 62 is selected. Once processing of block 62 has been completed, the top level is processed and top level block is selected for analysis. When all levels have been processed, the block processing procedure is complete. The block scan chain descriptions are then merged into a consolidated scan chain description which will be used to perform IDDq testing of the circuit. Similarly, the block test patterns will be merged into a consolidated test pattern set. These steps are described more fully with reference to FIG. 14. Step 124 will now be described in more detail with reference to FIG. 10.

Test pattern generation step 124 is performed on a gate level circuit description of an individual block. Generally, test patterns are generated by means of an Automatic Test Pattern Generator (ATPG) using any desired pattern generation model. Each quiescent current test pattern comprises a bit for each memory element in the block and peripheral memory elements for any embedded blocks located one level down in design hierarchy.

Figure 10:
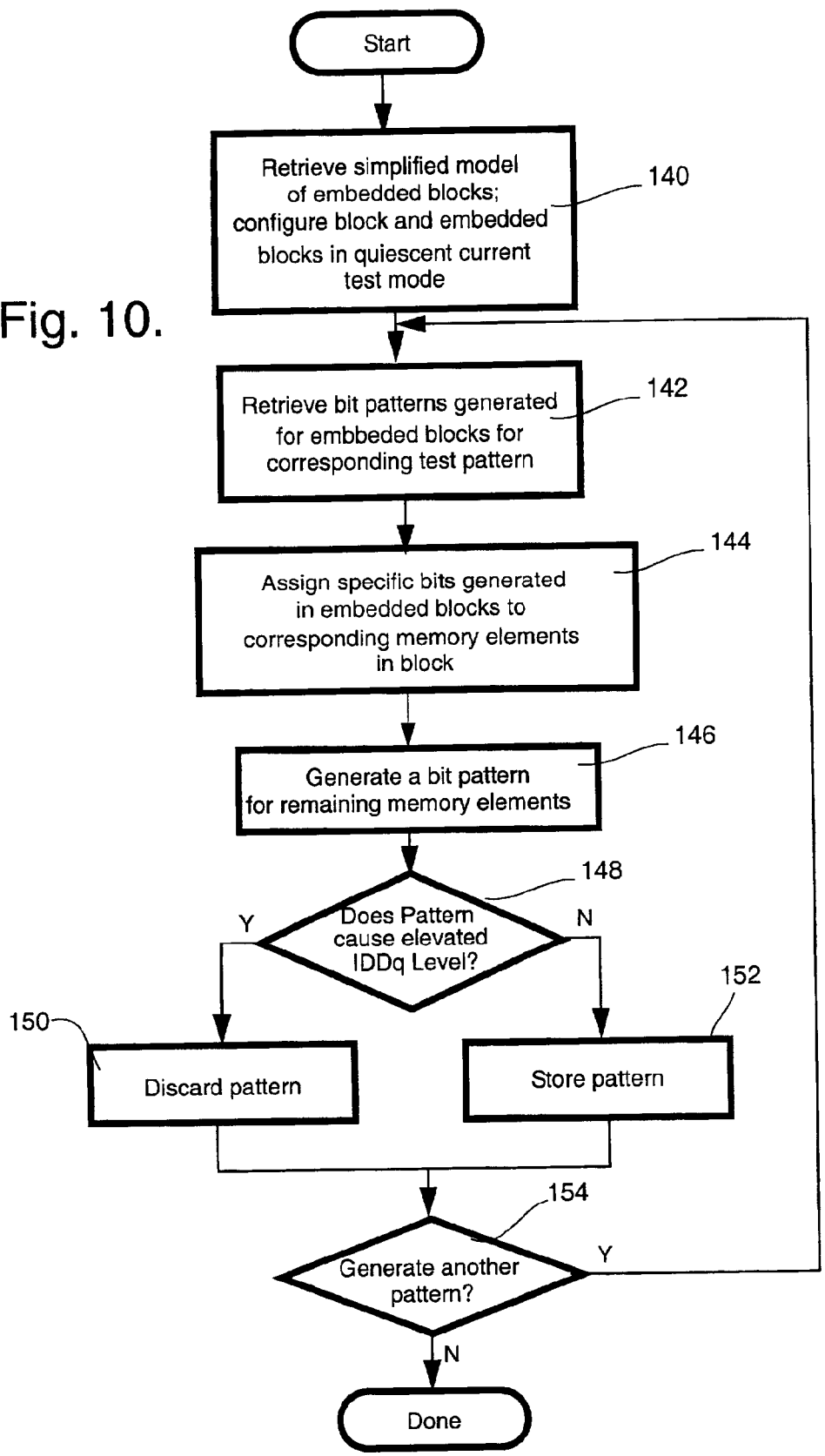
FIG. 10 is a flow chart illustrating in more detail the test pattern generation process, generally illustrated in FIG. 9.

Referring to FIG. 10, the first step 140 is to retrieve the simplified model of any embedded blocks located one level down in design hierarchy from the block being processed and to configure the block and all embedded blocks in quiescent current test mode. Next step 142 is to retrieve the bit patterns which were previously generated and stored for each embedded block located one level down in design hierarchy. In step 144, the test pattern is synchronized with the test patterns generated for embedded blocks so that the test patterns loaded in scan chains in the block are consistent with test patterns loaded in scan chains in the embedded blocks. This means that any specific or "care" bits (logic 1 or logic 0) which were generated for peripheral elements in embedded blocks are assigned to the peripheral elements of the embedded blocks. In addition, internal segments with serial inputs which originate from within embedded blocks are inspected to determine whether the source of the input branches to a segment in the embedded block. For example, referring to FIG. 5, the serial input of internal segment 80 of block 62 originates from the serial output of segment 90 in embedded block 64. The serial output of segment 90 also branches to the serial input of segment 84. Accordingly, any specific bits generated for segment 84 must be applied to corresponding memory elements in segment 80 of block 62. This will ensure that the test patterns which are generated for the scan path(s) of a block will be consistent with the scan path(s) of embedded blocks. Stated differently, memory elements which reside in different blocks but share the same source and are equidistant from the source, must receive the same bits.

In step 146, a test pattern bit is generated for all remaining memory elements of the block being processed and the peripheral elements of embedded blocks. This step may comprise generating a new pattern or using a bit pattern which was developed by the block designer.

In step 148, the pattern is examined to determine whether it would result in an elevated quiescent current level. The simplified model, if any, of embedded blocks is substituted for the complete description of the embedded block facilitate this examination. If the pattern would result in an elevated IDDq level, the pattern is discarded (step 150); otherwise, the pattern is stored (step 152). Step 154 determines whether another pattern is to be generated. If so, steps 144 to 154 are repeated. The number of patterns which are generated may be limited to a certain number of patterns, by desired fault coverage and other such factors, as would be obvious to a person skilled in the art.

In addition or as an alternative to steps 148 to 152, an analysis is performed to determine whether no certain circuit states would result in elevated quiescent current. This analysis can be a static analysis performed independently of the test patterns which will applied during quiescent current testing of the circuit. A static analysis assumes that all circuit states are possible. While a static analysis is more complex than other types of analyses, it is exhaustive in that it can verify that any predetermined sequence can be applied to the circuit. The analysis may, alternatively, consist of a simulation of the logic contained in the block using the test patterns which will be applied during actual quiescent current testing. While a simulation analysis is simpler than a static analysis, it is not exhaustive in that the results obtained with a specific sequence are not necessarily applicable to other sequences. The static analysis of the block may be performed prior to beginning the test pattern generation process (i.e. prior to step 142). If this analysis reveals that there are no circuit states which would result in elevated quiescent current levels, then steps 148 to 152 need not be performed. On the other hand, if such states exist, they are stored and excluded from the test pattern generation process.

The processing of a block further includes extracting and storing a scan chain description for each scan chain for the block. The descriptions are stored in an appropriate block specific electronic file on a computer readable storage medium. The scan chain description define the of the block memory element order which will be used to scan in the test patterns. As explained later, when all blocks, including the top level block, have been processed, the scan description of all blocks are merged to provide a consolidated scan chain description which will be used to perform quiescent current tests of the circuit.

The steps of test pattern generation, analysis, and fault simulation are performed on a circuit representation which includes only the boolean function of circuit gates. Timing considerations are not taken into account. The simulation consists of scanning in the test patterns and observing that the desired bit values have been loaded in the correct memory elements at the predicted time. The simulation can be performed either by simulating the entire circuit, i.e. all blocks, simultaneously, or by simulating the host circuit and a simplified model of each of its embedded blocks. When a simplified model is used for embedded blocks, the most efficient way of organizing the scan path segments inside the embedded blocks is to connect all peripheral scan path segments to a block input or to the output of another peripheral scan path segment so that all peripheral memory elements are at the beginning of the scan path segments and the simulation results of a block do not depend on values shifted through internal scan path segments. Verification can also be performed in a fully hierarchical manner.

As mentioned above, certain steps of the methods of designing differ slightly from one another depending on the nature or type of block. The present application is particularly concerned with blocks which require deterministic or block specific patterns.

As previously mentioned, the method of the present invention applies to blocks having many circuit states which, in a good circuit, result in elevated quiescent current. It has been shown above that method involves carefully choosing the quiescent current test patterns which will be applied during quiescent current testing, providing means for controlling the serial input(s) of such blocks independently of other blocks and driving the serial input of such blocks from their own source, separate from that of other blocks.

The method is performed by analyzing each block in isolation and generating a set of quiescent current vectors. Each test pattern includes a bit for each memory element in the block and the peripheral elements of any embedded blocks, using the peripheral memory element quiescent current test mode. For quiescent current testing, concern is only with controllability because full observation is assumed (i.e., observation is in the form of current measurements). The capture cycle, which is normally performed in other scan tests, does not contribute to the quiescent current coverage and, therefore, is not necessarily performed. Accordingly, the scan paths need not necessary be provided with a serial output connected to a circuit serial output.

Figure 11:
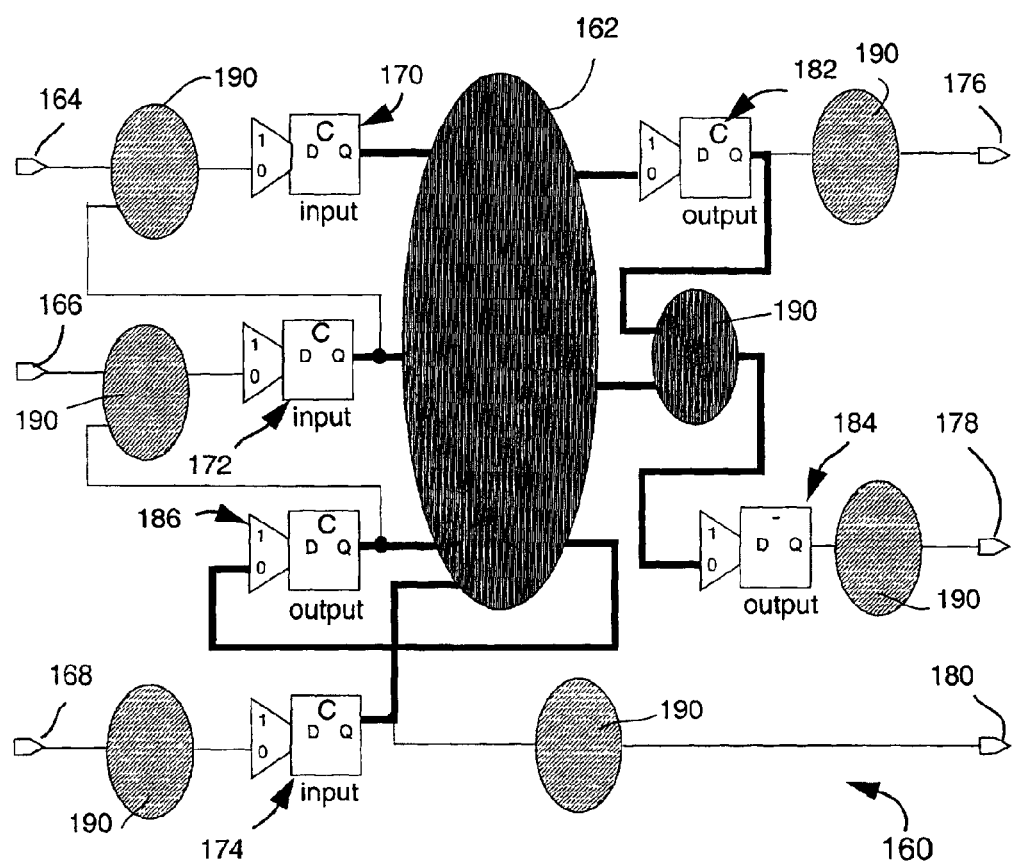
FIG. 11 is a circuit diagram of a hierarchical block having core logic between block inputs and output nodes and functional memory elements which are configurable as peripheral memory elements and showing the block configured in internal test mode.
Figure 12:
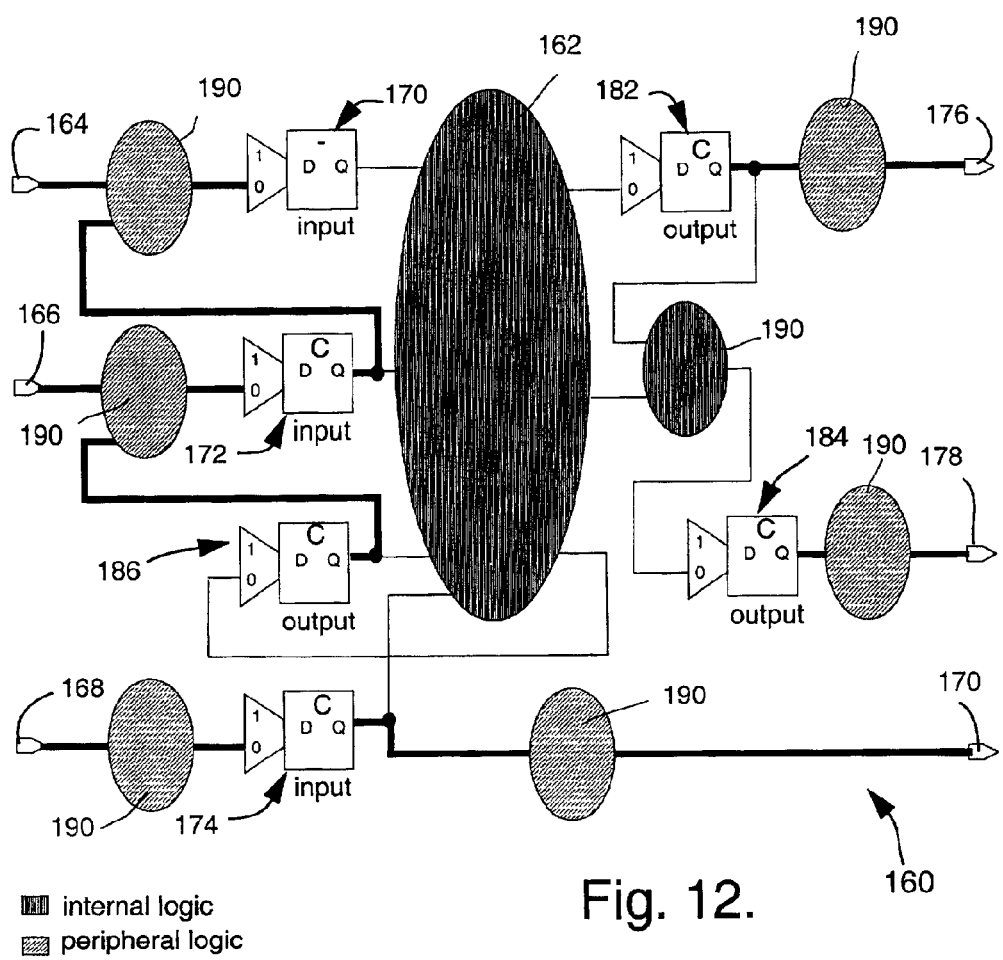
FIG. 12 is a circuit diagram of a hierarchical block having core logic between block inputs and output nodes and functional memory elements which are configurable as peripheral memory elements and showing the block configured in external test mode.

The method of FIG. 10 may be better understood by referring to FIGS. 11, 12 and 13. FIG. 11 illustrates a simple block 160 configured in internal test mode. FIG. 12 illustrates the same block configured in external test mode. The heavy or bolded lines in the figures indicate the paths and logic which is examined and tested in these modes. The block is comprised of combinational logic 162, three input nodes 164, 166, 168 and associated input peripheral memory elements 170, 172 and 174, respectively, three output nodes 176, 186, and 180 and output peripheral memory elements 182, 184 and 186. The peripheral memory elements shown are of the type disclosed in Applicant's prior application Ser. No. 09/626,877. In brief, these are functional memory elements which not only can be configured to perform as conventional peripheral memory elements, but also partition the logic in a block into internal logic 162 and peripheral logic 190. For simplicity, no internal memory elements have been shown in the figure.

When a block is the selected block in the method of FIG. 9, the block and any embedded blocks are configured in quiescent current test mode. When generating test patterns for the block, the block is examined to determine whether block inputs and outputs require controllability for internal testing. More specifically, considering only the necessity of controllability, input and output peripheral memory elements are examined and labeled with a C corresponding to needing controllability or "–" for not needing controllability for internal testing. All input peripheral memory elements would be labeled C, while some output memory elements may be labeled C or – depending on whether they control internal logic. In block 160, output peripheral elements 182 and 186 control internal logic and, therefore, require controllability for internal testing. All internal memory elements (none are shown in the figure) would be labeled C since they must be controlled. However, unlike peripheral elements, they do not need special treatment to deal with hierarchy issues.

Table 1 in FIG. 13, illustrates a plurality of test patterns which have been generated for the internal test mode configuration of block 160. The table includes bits for four additional memory elements, which are not shown in the figure, to illustrate internal memory elements. The patterns contain an "X" or "don't care" values where either the memory element does not contribute to IDDq testing of internal logic or coverage has already been obtained. Conversely, bits which contribute to IDDq testing of internal logic are assigned a logic 1 or a logic 0. These bits are "care" or "specific" bits. A sufficient number of care bits are provided for each element in a number of patterns to achieve the desired coverage. In addition, at least one pattern may be generated that contains a "don't care" value for each peripheral memory element for use in facilitating pattern generation of the block with the patterns which are generated for testing the external logic, as will be shown later. The latter patterns are patterns which will be generated for the parent block, one level up in design hierarchy.

FIG. 12 shows the same circuit as FIG. 11, but viewed in its external test mode which is the view of an embedded block when its parent block is being analyzed. Again, peripheral elements are labeled C or – depending on whether they need to be controlled for quiescent current testing of external logic. The logic and paths being tested is shown in heavy lines. Table 2 in FIG. 13, illustrates a set of test patterns which have been generated for the external test mode configuration of block 160. The same number of bit patterns have been generated for each of the two modes. It will be noted that the specific bits of the internal test mode patterns in Table 1 have been carried forward into the corresponding patterns of the external test mode in Table 2. These bits have been indicated by shading and bolding of the bit values for emphasis.

Taking FIG. 11 and FIG. 12 together gives a labeling of either CC, C–, or –C for internal controllability and external controllability, respectively, for each peripheral element. Memory elements labeled C– need to be controlled for internal logic quiescent current testing only, and memory elements labeled –C need to be controlled for external logic IDDq testing only. Memory elements labeled CC will need to be controlled for both internal and external logic IDDq testing. For example, output peripheral elements 182 and 186 affect both internal and external logic. Memory elements with label CC could lead to conflicts when trying to merge internal and external quiescent current test patterns generated independently. However, as mentioned above, the generation of external quiescent current test patterns must take into account constraints imposed by internal test patterns by not modifying care bits assigned to the same memory elements. It is possible that the constraints are such that the desired fault coverage cannot be achieved. By providing at least one internal quiescent current test pattern with "don't care" values in all CC peripheral memory elements, additional external patterns can be generated without having to consider constraints.

Figure 14:
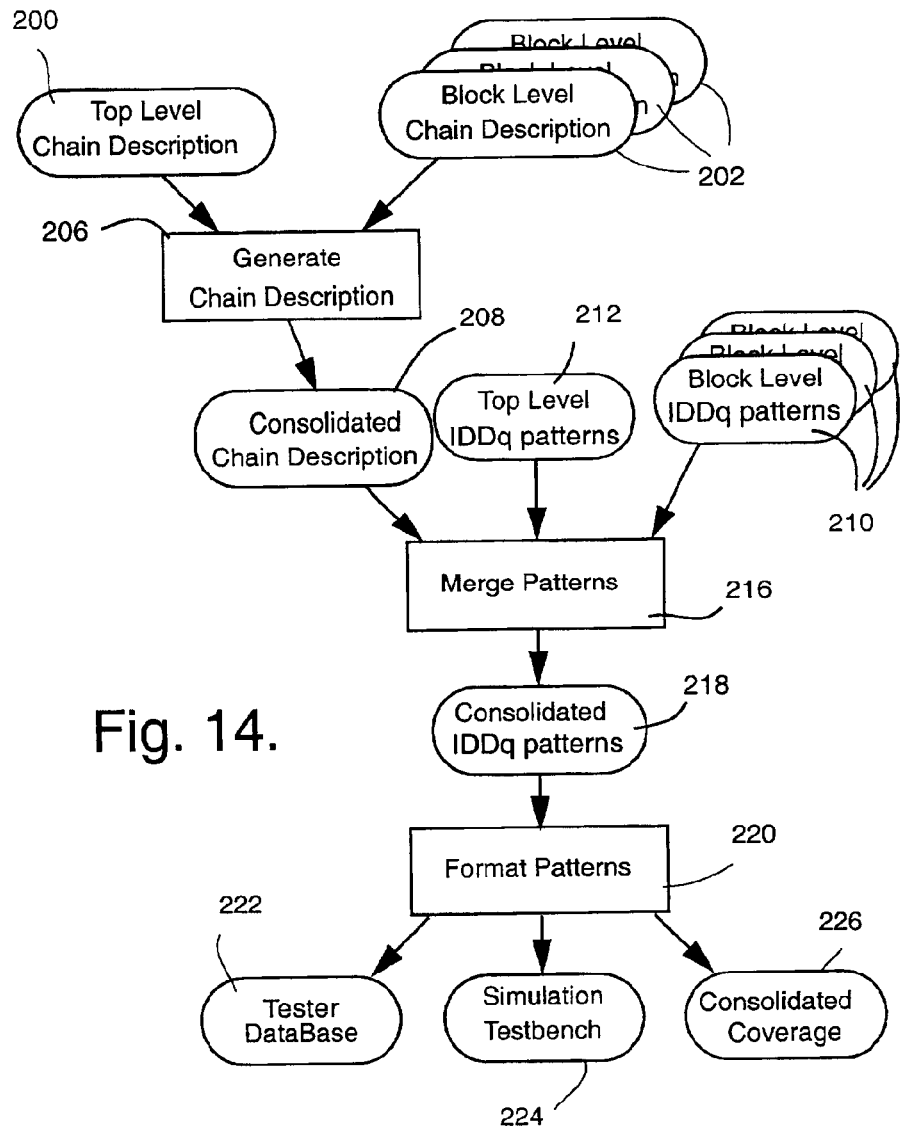
FIG. 14 is a flow chart illustrating the method by which IDDq scan chains and test vectors are consolidated and merged according to an embodiment of the present invention.

FIG. 14 shows a scan chain generation and test pattern merging process for a circuit having two levels of hierarchy. The process can be applied recursively if more levels are present. As shown in FIG. 14, the quiescent current test patterns for a block are stored in respective electronic files 210. Numeral 212 represents an IDDq pattern file associated with the top level block. Based on the preceding discussion, some IDDq patterns of an embedded block may contain "don't care" values for any memory elements that may be required for control during external (chip or parent block level) testing, and during internal testing These are the memory elements labeled CC in the preceding discussion.

Pattern generation at the top level with hierarchical designs is performed in the same manner as for embedded blocks, i.e. by running a pattern analysis and generation software tool using shell or simplified models for selected embedded blocks. Top level test pattern file 212, similar to the block level pattern files 210, is generated for the top level. In a flat or non-hierarchical logic design, the patterns generated in this manner may be used directly as quiescent current patterns for manufacturing test. For hierarchical designs, the patterns of embedded blocks must be merged with those of its parent block. The merging process is performed after the various block quiescent current scan chains have been consolidated. To that end, a software tool 206 generates a full scan chain description 208 from top level chain description 200 and block chain descriptions 202. Once the overall chain is defined, control values associated with memory elements are mapped from individual block views to the top level block view.

A software tool 216 merges block level patterns 210 with the top level test patterns 212 to produce consolidated test patterns 218, which are stored. It will be understood by those skilled in the art that the method of FIG. 10 associates bit values with memory elements. However, the method does not arrange the bit values in the order in which the values will be scanned into the circuit prior to quiescent current scan testing. That cannot be performed until all bit patterns have been generated for all blocks and scan chain descriptions have been defined. Corresponding patterns of the various block pattern sets are merged, one pattern at a time. In other words, the first pattern of all blocks are merged together, the second pattern of all blocks are merged together, and so on. A value is assigned to each memory element of the consolidated scan chains for each pattern. Generally, the value is obtained from the pattern file of the block containing the memory element. However, as with the test pattern generation process described with reference to FIG. 10, it is necessary to synchronize corresponding patterns of parent and embedded blocks during the pattern merging process. For peripheral memory elements labeled CC (i.e. elements which require controllability for both internal and external testing), the value is obtained from the pattern of the parent block of the block containing the memory element. For memory elements which reside on a branch in a scan path which extends between a parent block and an embedded block, the value is selected from the pattern of the parent block. The values in the pattern of the parent block will contain the care values generated for the embedded block as well as the care values generated for the parent block by virtue of the synchronization performed in the test pattern generation process (FIG. 10).

Finally, another software tool 220 formats the consolidated test patterns for a tester program or database 222, generates a simulation testbench and produces a consolidated fault coverage report 226.

The present invention can accommodate blocks of the type described in the present application, which require block specific test patterns, with the type of blocks described in the above mentioned cross-reference application, in which non-specific or pseudo random test patterns may be used. To do so, the patterns generated for the latter block types can be stored in the same manner in which patterns are stored according to the method of the present invention. Consider a blocks designed according to the cross-reference application and using the predetermined sequence of bits was fault simulated. Suppose that a quiescent current measurement was taken every 100 cycles. This means that the first pattern would consist of the first N bits of the predetermined sequence of bit beyond the reference point described in the application. These bits would be assigned to the various memory elements of the chain according to the chain order specified in the block scan chain description. The next pattern would consist of the N bits of the sequence starting 100 cycles after the reference point. And so on. These blocks would not need to be re-analyzed. Embedded blocks of this type would pass constraints (the specific bits) to the parent block the same way as the type of block in the present invention. This works because all chains are re-initialized on every pattern. Thus, the patterns of the block types of the previous application are merged with the patterns of the block type of the present invention because they do not look any different.

It will be understood by those skilled in the art that the best mode of carrying out the method of the present invention is by means of computer software tools.

All the connections indicated in the description in the claims are "logical" connections meaning that the connections are made during the test mode of interest (i.e. quiescent current measurements). This means that the connections could be made through logic (e.g. multiplexers or other gates) as opposed to direct connections.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth herein above are not intended to limit the breadth of the present invention, which should be inferred only from the following claims and their appropriately construed legal equivalents.

We claim:

1. A method of designing a circuit having at least one hierarchical block which requires block specific test patterns to facilitate quiescent current testing of the circuit, comprising, for each block requiring block specific test patterns:

configuring the block and any embedded blocks located one level down in design hierarchy in quiescent current test mode in which input peripheral memory elements are configured in internal test mode and output peripheral memory elements are configured in external test mode;

generating quiescent current test patterns which do not result in elevated quiescent current levels when applied to said block and which include a bit for all memory elements in said block and any peripheral memory elements in any embedded blocks located one level down in design hierarchy; and if said block contains embedded blocks, synchronizing each test pattern with a corresponding test pattern generated for embedded blocks so that test patterns loaded in scan chains in the block are consistent with test patterns loaded in scan chains in said embedded blocks.

2. A method as defined in claim 1, further including merging block level test patterns using a circuit consolidated quiescent current scan chain description to provide a consolidated set of circuit quiescent current test patterns for use in quiescent current testing of said circuit.

3. A method as defined in claim 2, said merging block level test patterns further including, for corresponding patterns of block test patterns, assigning a value to each memory element on each scan chain of said consolidated scan chain description, said assigning including extracting the value from the pattern of the block containing the memory element when the memory element requires controllability for internal testing only and extracting the value from the pattern of the parent block of the block containing the memory element when the memory element requires controllability for both internal and external testing.

4. A method as defined in claim 3, said merging including, for memory elements which share a source with memory elements in a parent or embedded block, selecting values for said memory elements from the pattern generated for the parent block.

5. A method as defined in claim 4, further including modifying the test pattern of said embedded block to correspond to values selected from the pattern of the parent block.

6. A method as defined in claim 1, said synchronizing including assigning to peripheral memory elements of embedded blocks, specific bits assigned to the peripheral memory elements in a corresponding test pattern generated for said embedded blocks.

7. A method as defined in claim 1, said synchronizing including determining whether a memory element segment in the block shares a common input with a segment in an embedded block and, if so, assigning to memory elements in the segment, and in any dependent segments, any specific bits assigned to memory elements in the embedded block segment, and any dependent segments, for a corresponding test pattern.

8. A method as defined in claim 7, said determining whether a segment in the block shares a common input including determining whether the distance in bits from the block serial input of said block segment is the same as the distance in bits from the embedded block serial input to its block serial input.

9. A method as defined in claim 1, said synchronization including modifying a test pattern previously generated for an embedded block to incorporate therein a specific bit of a block being processed.

10. A method as defined in claim 1, said generating quiescent current patterns for blocks in said circuit beginning with blocks at a lowest level of hierarchy and proceeding in sequence through each level of design hierarchy to a highest level of hierarchy containing a top-level block.

11. A method as defined in claim 1, further including, prior to generating said test patterns, performing a static analysis of said block and of a simplified model of embedded block to determine whether no circuit states would cause elevated quiescent current levels.

12. A method as defined in claim 11, further including, if said static analysis identified circuit states which cause an elevated quiescent current level, then, after generating a test pattern for a block, examining the test pattern to determine whether it would result in an elevated quiescent current level and discarding the test pattern if an elevated current level would result and storing the test pattern if no elevated current level would result.

13. A method as defined in claim 1, further including calculating a fault coverage for said block.

14. A method as defined in claim 13, said calculating a fault coverage including calculating the total fault coverage for said block by calculating the weighted sum of the fault coverages of said block and of embedded blocks located one level of design hierarchy.

15. A method as defined in claim 14, said weighted sum being based on the number of gates in each of said block and embedded blocks located one level down in design hierarchy.

16. A method as defined in claim 15, further including determining and storing the number of gates of the block and the cumulative fault coverage for each test pattern.

17. A method as defined in claim 16, said calculating fault coverage including using a pseudo stuck-at fault coverage model or a toggle fault coverage model.

18. A method as defined in claim 1, further including generating and storing a simplified model of said block.

19. A method as defined in claim 1, further including simulating said test patterns to verify their correctness.

20. A method as defined in claim 1, wherein, prior to generating quiescent current test patterns for said block, arranging scannable memory elements in each block into quiescent current scan chain segments in which the segments are arranged on a scan path which originates from or includes a block serial input by connecting a segment serial input to: a block input, the serial output of another segment or the serial output of a segment located in an embedded block one level down in design hierarchy and by connecting block serial inputs of embedded blocks to block serial inputs.

21. A method as defined in claim 20, further including arranging internal memory element segments of a block on a scan path which originates from a block input by connecting the serial input of internal segments to a block input, the serial output of another segment in the block or the serial output of a peripheral segment located in an embedded block and connecting the serial input of scan paths which include internal segments of embedded blocks to a block serial input.

22. A method as defined in claim 21, further including, arranging peripheral memory element segments of a block on a scan path which does not include any branches and which originates from or includes a block serial input by connecting the serial input of each peripheral segment to a block input, or to the serial output of another peripheral segment and connecting the serial input of scan paths consisting exclusively of peripheral segments of embedded blocks are connected to to a block serial input, to the serial output of another segment within the block or to the serial output of a peripheral segment located in an embedded block.

23. A method as defined in claim 20, further including, arranging peripheral memory element segments of a block on a scan path which does not include any branches and which originates from or includes a block serial input by connecting the serial input of each peripheral segment to a block input or to the serial output of another peripheral segment and connecting the serial input of scan paths consisting exclusively of peripheral segments of embedded blocks to a block serial input, to the serial output of another segment within the block or to the serial output of a peripheral segment located in an embedded block.

24. A method as defined in claim 23, further including generating and storing on a computer readable storage medium a scan chain description for each said scan path in the block.

25. A method as defined in claim 24, further including consolidating said scan chain descriptions into a consolidated scan chain description for use in performing quiescent current testing of said circuit.

26. A method as defined in claim 1, further including storing said quiescent current test patterns for each block on a computer readable storage medium.

27. A method of designing a circuit having at least one hierarchical block which requires block specific test patterns to facilitate quiescent current testing of the circuit, comprising:

arranging scannable memory elements in each block requiring block specific test patterns into quiescent current scan chain segments in which the segments are arranged on a scan path which originates from or includes a block serial input by connecting a segment serial input to a block serial input, to the serial output of another segment in the block or to the serial output of a segment located in an embedded block one level down in design hierarchy and by connecting the block serial input of embedded blocks to the block serial input;

configuring the block and any embedded blocks located one level down in design hierarchy in quiescent current test mode in which input peripheral memory elements are configured in internal test mode and output peripheral memory elements are configured in external test mode;

generating quiescent current test patterns which do not result in elevated quiescent current levels when applied to said block, each test pattern including a bit for all memory elements in the block and peripheral memory elements in any embedded blocks located one level down in design hierarchy; and synchronizing each test pattern with a corresponding test pattern generated for embedded blocks so that test patterns loaded in scan chains in the block are consistent with test patterns loaded in scan chains in said embedded blocks, said synchronizing including assigning to peripheral memory elements of embedded blocks, specific bits assigned to the peripheral memory elements in a corresponding test pattern generated for said embedded blocks and determining whether a memory element segment in the block shares a common input with a segment in an embedded block and, if so, assigning to memory elements in the segment, and in any dependent segments, any specific bits assigned to memory elements in the embedded block segment and any dependent segments for a corresponding test pattern.

28. A method as defined in claim 27, further including, after test patterns have been generated for all selected blocks, merging block level test patterns using a circuit consolidated quiescent current scan chain description to provide a consolidated set of circuit quiescent current test patterns for use in quiescent current testing of said circuit.

29. A method as defined in claim 28, said merging block level test patterns further including, for corresponding patterns of block test patterns, assigning a value to each memory element on each scan chain of said consolidated scan chain description, said assigning including extracting the value from the pattern of the block containing the memory element when the memory element requires controllability for internal testing only and extracting the value from the pattern of the parent block of the block containing the memory element when the memory element requires controllability for both internal and external testing.

30. A method as defined in claim 29, said merging including, for memory elements which share a source with memory elements in a parent or embedded block, selecting values for said memory elements from the pattern generated for the parent block.

31. A method as defined in claim 30, further including modifying the test pattern of said embedded block to correspond to values selected from the pattern of the parent block.

32. A method as defined in claim 29, further including, after generating a test pattern, examining the test pattern to determine whether it would result in an elevated quiescent current level, discarding the test pattern if an elevated current level would result and storing the test pattern if no elevated current level would result.

33. A method as defined in claim 32, further including arranging internal memory element segments of a block on a scan path which originates from a block input by connecting the serial input of internal segments to a block input, to the serial output of another segment in the block or to the serial output of a peripheral segment located in an embedded block without creating branches on the scan path and connecting the serial input of scan paths which include internal segments of embedded blocks to a block serial input.

34. A method as defined in claim 33, further including, arranging peripheral memory element segments of a block on a scan path which originates from or includes a block serial input by connecting the serial input of each peripheral segment to a block input, to or to the serial output of another peripheral segment and connecting the serial input of scan paths consisting exclusively of peripheral segments of embedded blocks are connected to to a block serial input, to the serial output of another segment within the block or to the serial output of a peripheral segment located in an embedded block without any branches on the scan path.

35. A method as defined in claim 34, further including, prior to generating said test patterns, analyzing said block to determine circuit states which would not cause elevated quiescent current levels, said generating quiescent current test patterns using bit patterns corresponding to said circuit states.

36. A method as defined in claim 35, said analyzing said block including performing a static analysis of said block to determine whether no circuit states cause elevated current values.

37. A method as defined in claim 35, said generating test patterns including using a predetermined simplified model for selected embedded blocks.

38. A method as defined in claim 37, further including calculating a fault coverage for said block.

39. A method as defined in claim 38, said calculating a fault coverage comprising calculating a weighted fault coverage.

40. A method as defined in claim 39, further including generating and storing a simplified model of said block.

41. A method as defined in claim 40, further including simulating said test patterns to verify their correctness.

42. A program product of designing a circuit having at least one hierarchical block which requires block specific test patterns to facilitate quiescent current testing of the circuit, comprising:

a computer readable storage medium;
means recorded on said storage medium for, for each block requiring block specific test patterns, configuring the block and any embedded blocks located one level down in design hierarchy in quiescent current test mode in which input peripheral memory elements are configured in internal test mode and output peripheral memory elements are configured in external test mode;

means recorded on said storage medium for generating quiescent current test patterns which do not result in elevated quiescent current levels when applied to said block and which include a bit for all memory elements in said block and peripheral memory elements in embedded blocks located one level down in design hierarchy; and means recorded on said storage medium for synchronizing each test pattern with a corresponding test pattern generated for embedded blocks so that test patterns loaded in scan chains in the block are consistent with test patterns loaded in scan chains in said embedded blocks.

43. A program product as defined in claim 42, said means for synchronizing being operable to assign to peripheral memory elements of embedded blocks, specific bits assigned to the peripheral memory elements in a corresponding test pattern generated for said embedded blocks.

44. A program product as defined in claim 42, said means for synchronizing including means for determining whether a memory element segment in the block shares a common input with a segment in an embedded block and, if so, assign to memory elements in the segment, and in any dependent segments, any specific bits assigned to memory elements in the embedded block segment, and any dependent segments, for a corresponding test pattern.

45. A program product as defined in claim 44, said means for determining including means for determining whether the distance in bits from the block serial input of said block segment is the same as the distance in bits from the embedded block serial input to its block serial input.

46. A program product as defined in claim 42, said means for synchronization including means for modifying a test pattern previously generated for an embedded block to incorporate therein a specific bit of a block being processed.

47. A program product as defined in claim 42, said means for generating quiescent current patterns for blocks in said circuit beginning with blocks at a lowest level of hierarchy and proceeding in sequence through each level of design hierarchy to a highest level of hierarchy containing a top-level block.

48. A program product as defined in claim 42, further including means recorded on said medium for performing a static analysis of said block and of a simplified model of embedded blocks one level down in design hierarchy to determine whether no circuit states would cause elevated quiescent current levels.

49. A program product as defined in claim 48, said means for generating further including means recorded on said medium for examining a test pattern to determine whether the test pattern would result in an elevated quiescent current level, discarding the test pattern if an elevated current level would result and storing the test pattern if no elevated current level would result.

50. A program product as defined in claim 42, further including means recorded on said storage medium for calculating a fault coverage for said block.

51. A program product as defined in claim 50, said means for calculating a fault coverage including calculating a total fault coverage for the block by calculating the weighted sum of the fault coverages of said block and of embedded blocks located one level of design hierarchy.

52. A program product as defined in claim 51, said means for calculating being operable to calculate a weighted sum based on the number of gates in each of said block and embedded blocks located one level down in design hierarchy.

53. A program product as defined in claim 52, further including means recorded on said storage medium for determining and storing the number of gates of the block and the cumulative fault coverage for each test pattern.

54. A program product as defined in claim 53, said means for calculating a fault coverage being operable to use a pseudo stuck-at fault coverage model or a toggle fault coverage model.

55. A program product as defined in claim 42, further including means recorded on said storage medium for generating and storing a simplified model of said block.

56. A program product as defined in claim 42, further including means recorded on said storage medium for simulating said test patterns to verify their correctness.

57. A program product as defined in claim 42, further including means recorded on said storage medium for arranging scannable memory elements in said block into quiescent current scan chain segments in which the segments are arranged on a scan path which originates from or includes a block serial input by connecting a segment serial input to: a block input, the serial output of another segment or the serial output of a segment located in an embedded block one level down in design hierarchy and by connecting block serial inputs of embedded blocks to block serial inputs.

58. A program product as defined in claim 57, said means for arranging being operable to arrange internal memory element segments of a block on a scan path which originates from a block input by connecting the serial input of internal segments to a block input, the serial output of another segment in the block or the serial output of a peripheral segment located in an embedded block and connecting the serial input of scan paths which include internal segments of embedded blocks to a block serial input.

59. A program product as defined in claim 58, said means for arranging being operable to arrange peripheral memory element segments of a block on a scan path which does not include any branches and which originates from or includes a block serial input by connecting the serial input of each peripheral segment to a block input, or to the serial output of another peripheral segment and connecting the serial input of scan paths consisting exclusively of peripheral segments of embedded blocks are connected to to a block serial input, to the serial output of another segment within the block or to the serial output of a peripheral segment located in an embedded block.

60. A program product as defined in claim 58, said means for arranging being operable to arrange peripheral memory element segments of a block on a scan path which does not include any branches and which originates from or includes a block serial input by connecting the serial input of each peripheral segment to a block input or to the serial output of another peripheral segment and connecting the serial input of scan paths consisting exclusively of peripheral segments of embedded blocks to a block serial input, to the serial output of another segment within the block or to the serial output of a peripheral segment located in an embedded block.

61. A program product as defined in claim 60, further including means recorded on said storage medium for generating and storing on a computer readable storage medium a scan chain description for each said scan path in the block.

62. A program product as defined in claim 61, further including means recorded on said storage medium for consolidating said scan chain descriptions into a consolidated scan chain description for use in performing quiescent current testing of said circuit.

63. A program product as defined in claim 42, further including means recorded on said storage medium for storing said quiescent current test patterns for each block on a computer readable storage medium.

64. A program product as defined in claim 42, further including means recorded on said storage medium for merging block level test patterns with a consolidated scan chain description for the circuit to provide a consolidated set of circuit quiescent current test patterns for use in quiescent current testing of said circuit.

65. A program product as defined in claim 64, said means for merging block level test patterns further including, for corresponding patterns of block test patterns, means for assigning a value to each memory element on each scan chain of said consolidated scan chain description, said means for assigning extracting the value from the pattern of the block containing the memory element when the memory element requires controllability for internal testing only and extracting the value from the pattern of the parent block of the block containing the memory element when the memory element requires controllability for both internal and external testing.

66. A method as defined in claim 65, said merging including, for memory elements which share a source with memory elements in a parent or embedded block, selecting values for said memory elements from the pattern generated for the parent block.

67. A method as defined in claim 66, further including modifying the test pattern of said embedded block to correspond to values selected from the pattern of the parent block.

68. A program product of designing a circuit having at least one hierarchical block which requires block specific test patterns to facilitate quiescent current testing of the circuit, comprising:

a computer readable storage medium;

means recorded on said storage medium for arranging scannable memory elements in each block requiring block specific test patterns into quiescent current scan chain segments in which the segments are arranged on a scan path which originates from or includes a block serial input by connecting a segment serial input to a block serial input, to the serial output of another segment in the block or to the serial output of a segment located in an embedded block one level down in design hierarchy and by connecting the block serial input of embedded blocks to the block serial input;

means recorded on said storage medium for configuring the block and any embedded blocks located one level down in design hierarchy in quiescent current test mode in which input peripheral memory elements are configured in internal test mode and output peripheral memory elements are configured in external test mode;

means recorded on said storage medium for generating quiescent current test patterns which do not result in elevated quiescent current levels when applied to said block, each test pattern including a bit for all memory elements in the block and peripheral memory elements in any embedded blocks located one level down in design hierarchy; and means recorded on said storage medium for synchronizing each test pattern with a corresponding test pattern generated for embedded blocks so that test patterns loaded in scan chains in the block are consistent with test patterns loaded in scan chains in said embedded blocks, said means for synchronizing including means for assigning to peripheral memory elements of embedded blocks, specific bits assigned to the peripheral memory elements in a corresponding test pattern generated for said embedded blocks and for determining whether a memory element segment in the block shares a common input with a segment in an embedded block and, if so, for assigning to memory elements in the segment, and in any dependent segments, any specific bits assigned to memory elements in the embedded block segment and any dependent segments for a corresponding test pattern.

69. A program product as defined in claim 68, further including means recorded on said storage medium for merging block level test patterns with a consolidated scan chain description for the circuit to provide a consolidated set of circuit quiescent current test patterns for use in quiescent current testing of said circuit, said means for merging block level test patterns further including, for corresponding patterns of block test patterns, means for assigning a value to each memory element on each scan chain of said consolidated scan chain description, said means for assigning extracting the value from the pattern of the block containing the memory element when the memory element requires controllability for internal testing only and extracting the value from the pattern of the parent block of the block containing the memory element when the memory element requires controllability for both internal and external testing.

70. A program product as defined in claim 68, further including means recorded on said storage medium for, after generating a test pattern, examining the test pattern to determine whether it would result in an elevated quiescent current level, discarding the test pattern if an elevated current level would result and storing the test pattern if no elevated current level would result.

71. A program product as defined in claim 70, said means for arranging being further operable to arrange internal memory element segments of a block on a scan path which originates from a block input by connecting the serial input of internal segments to a block input, to the serial output of another segment in the block or to the serial output of a peripheral segment located in an embedded block without creating branches on the scan path and connecting the serial input of scan paths which include internal segments of embedded blocks to a block serial input.

72. A program product as defined in claim 71, said means for arranging being further operable to arrange peripheral memory element segments of a block on a scan path which originates from or includes a block serial input by connecting the serial input of each peripheral segment to a block input, to or to the serial output of another peripheral segment and connecting the serial input of scan paths consisting exclusively of peripheral segments of embedded blocks are connected to to a block serial input, to the serial output of another segment within the block or to the serial output of a peripheral segment located in an embedded block without any branches on the scan path.

73. A program product as defined in claim 72, further including means recorded on said storage medium for analyzing said block to determine circuit states which would not cause elevated quiescent current levels, said generating quiescent current test patterns using bit patterns corresponding to said circuit states.

74. A program product as defined in claim 73, said means for analyzing said block including means for performing a static analysis of said block to determine whether no circuit states cause elevated current values.

75. A program product as defined in claim 73, said means for generating test patterns using a simplified model for selected embedded blocks.

76. A program product as defined in claim 75, further including means recorded on said storage medium for calculating a fault coverage for said block.

77. A program product as defined in claim 76, said means for calculating a fault coverage being operable to calculate a weighted fault coverage.

78. A program product as defined in claim 77, further including means recorded on said storage medium for generating and storing a simplified model of said block.

79. A program product as defined in claim 78, further including means recorded on said storage medium for simulating said test patterns to verify their correctness.

* * * * *